(12) United States Patent
Chen et al.

(10) Patent No.: US 9,832,013 B2
(45) Date of Patent: Nov. 28, 2017

(54) PHASED CLOCK ERROR HANDLING

(71) Applicant: ORACLE INTERNATIONAL CORPORATION, Redwood City, CA (US)

(72) Inventors: Ben Li Chen, San Jose, CA (US); Zuxu Qin, Stanford, CA (US); Nima Edelkhani, San Jose, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 0 days.

(21) Appl. No.: 15/012,518

(22) Filed: Feb. 1, 2016

(65) Prior Publication Data

US 2017/0222796 A1 Aug. 3, 2017

(51) Int. Cl.
| | |
|---|---|
| *H04L 7/033* | (2006.01) |
| *H04L 7/04* | (2006.01) |
| *H04L 7/00* | (2006.01) |
| *G01R 25/00* | (2006.01) |
| *H03K 5/156* | (2006.01) |
| *H03K 5/151* | (2006.01) |
| *H03K 23/58* | (2006.01) |

(52) U.S. Cl.
CPC .......... *H04L 7/0337* (2013.01); *G01R 25/005* (2013.01); *H04L 7/0025* (2013.01); *H04L 7/0037* (2013.01); *H03K 5/151* (2013.01); *H03K 5/1565* (2013.01); *H03K 23/58* (2013.01)

(58) Field of Classification Search
CPC ..... H04L 7/0037; H04L 7/0025; H04L 7/033; H04L 7/0337; H03L 7/0814; G06F 1/08; H03K 5/1565; H03K 5/151; H03K 23/58; G01R 25/005
See application file for complete search history.

(56) References Cited

U.S. PATENT DOCUMENTS

| 5,012,142 A * | 4/1991 | Sonntag ................. H03K 5/133 327/158 |
|---|---|---|
| 6,347,366 B1 * | 2/2002 | Cousins ................ G06F 9/5016 711/156 |
| 7,236,028 B1 * | 6/2007 | Choi ..................... H03L 7/0812 327/149 |

(Continued)

*Primary Examiner* — Michelle M Koeth
(74) *Attorney, Agent, or Firm* — Marsh Fischmann & Breyfogle LLP; Daniel J. Sherwinter (57) ABSTRACT

Embodiments include systems and methods for detecting and correcting phased clock error (PCE) in phased clock circuits (e.g., in context of serializer/deserializer (SERDES) transmission (TX) clock circuits). For example, phased input clock signals can be converted into unit interval (UI) clocks, which can be combined to form an output clock signal. PCE in the output clock signal can be detected by digitally sampling the UI clocks to characterize their respective clock pulse widths, and comparing the respective clock pulse widths (i.e., PCE in the output clock signal can result from pulse width differences in UI clocks). Delay can be applied to one or more UI clock generation paths to shift UI clock pulse transitions, thereby adjusting output clock pulse widths to correct for the detected PCE. Approaches described herein can achieve PCE detection over a wide error range and can achieve error correction with small resolution.

19 Claims, 7 Drawing Sheets

(56) References Cited

U.S. PATENT DOCUMENTS

| | | | | |
|---|---|---|---|---|
| 7,884,661 B2* | 2/2011 | Choi | ............... | G11C 7/1051 |
| | | | | 327/291 |
| 8,874,999 B1* | 10/2014 | Taylor | ............... | H03L 7/0994 |
| | | | | 714/775 |
| 2008/0191772 A1* | 8/2008 | Pickering | ............... | H03K 5/00006 |
| | | | | 327/243 |
| 2013/0002318 A1* | 1/2013 | Lu | ............... | H03L 7/0995 |
| | | | | 327/156 |
| 2014/0062551 A1* | 3/2014 | Bhaumik | ............... | H03L 7/0805 |
| | | | | 327/158 |

* cited by examiner

PHASED CLOCK ERROR HANDLING

FIELD

Embodiments relate generally to clock circuits, and, more particularly, to techniques for detection and correction of error in phased clock circuits, such as quadrature clocks.

BACKGROUND

Serializer/deserializer (SERDES) circuits are becoming ubiquitous in many computational environments. The SERDES can compress a relatively wide, parallel input into a relatively narrow, serial signal (e.g., a single "bit," differential signal) for communication over a serial bus. The serial bus switches at an appreciably higher rate than the parallel bus, and serial communication of the data stream tends to reduce cost, complexity, power, and board real estate relative to comparable parallel communications. As bus speeds increase, parallel communications manifest even higher power consumption and more issues relating to timing (e.g., skew mismatches and bit misalignment), making SERDES circuits even more attractive.

Some SERDES applications use phased clocks to reduce power and complexity. For example, four clock signals can be generated by separate clocks at a same nominal frequency, separated from each other by 90-degrees, and combined to effectively generate four times the data rate of any of the clocks individually. However, slight differences between the multiple, separate, phased clocks (e.g., differences in their respective phase-locked loops, manufacturing variance, clock distribution, etc.) can cause deterministic jitter and/or other error in the combined clock output. When four phased clocks are used, the clocks can be considered "quadrature clocks" and the error can be considered as "quadrature error." or "QE." For example, when such phased clocks are used for a SERDES transmission clock, particularly at very high data rates, the deterministic jitter (e.g., QE) can appreciably impact link performance.

BRIEF SUMMARY

Among other things, embodiments provide novel systems and methods for detecting and correcting phased clock error (PCE) in phased clock circuits. Some embodiments operate in context of a transmission (TX) clock circuit of a serializer/deserializer (SERDES). For example, phased input clock signals can be converted into unit interval (UI) clocks, which can be combined to form an output clock signal. PCE in the output clock signal can be detected by digitally sampling the UI clocks to characterize their respective clock pulse widths, and comparing the respective clock pulse widths. For example, any difference in clock pulse width greater than a predetermined threshold amount can be considered as PCE. Some implementations can generate delay in one or more UI clock generation paths to shift UI clock pulse transitions, thereby adjusting output clock pulse widths to correct for the detected PCE. Some implementations include additional functionality, such as detection sensitivity adjustment, and techniques for improving performance using voting and "ping-pong exiting." Approaches described herein can achieve PCE detection over a wide error range and can achieve error correction with small resolution.

According to one set of embodiments, a phased clock error handling system is provided. The system includes a unit interval (UI) clock circuit, and a phased clock error (PCE) detector circuit. The unit interval (UI) clock circuit includes: a number of phased clock inputs, each coupled with an output of a respective one of a number of phased clocks; and a number of UI clock signal outputs. The phased clock error (PCE) detector circuit includes: a UI clock selector coupled with the number of UI clock signal outputs; a digital sampler having a selected UI clock input and a clock pulse width output, the selected UI clock input coupled with the UI clock selector to receive a selected one of the number of UI clock signal outputs; and a PCE output that indicates a detected PCE when a first clock pulse width differs from a second clock pulse width by more than a predetermined threshold amount. The first clock pulse width is received from the clock pulse width output in response to digitally sampling a first selected one of the number of UI clock signal outputs, the second clock pulse width is received from the clock pulse width output in response to digitally sampling a second selected one of the number of UI clock signal outputs, and the first and second selected ones of the number of UI clock signal outputs share a clock pulse edge.

According to another set of embodiments, a method is provided for phased clock error handling. The method includes: generating a number of unit interval (UI) clock signals, each from a respective pair of a received number of phased clock inputs; selecting a first UI clock signal and a second UI clock signal from the number of generated UI clock signals, such that the first and second selected UI clock signals share a clock pulse edge; first sampling the first selected UI clock signal, digitally, to determine a first clock pulse width; second sampling the second selected UI clock signal, digitally, to determine a second clock pulse width; and detecting whether there is a phased clock error (PCE) in response to determining that the first and second clock pulse widths differ by more than a predetermined threshold amount.

According to another embodiment, a serializer/deserializer (SERDES) transmit clock system is provided. The system includes: a unit interval (UI) clock circuit that generates a N UI clock signal outputs from N phased clock inputs, each of the N phased clock inputs phase delayed from another of the N phased clock inputs by 360/N degrees, each of the UI clock signal outputs having an associated UI delay; a phased clock error (PCE) detector circuit, coupled with the UI clock circuit, that detects PCE by determining clock pulse width differences between pairs of the UI clock signal outputs, each pair having a respective shared clock pulse edge; a PCE correction circuit, coupled with the PCE detector circuit and the UI clock circuit, that adjusts the UI delays associated with the UI clock signal outputs according to the detected PCE; and a clock output circuit, coupled with UI clock circuit, that generated a SERDES transmit clock from a combination of the number of UI clock signal outputs.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

Many electronics applications include communications channels that have transmitter and receiver components to move data through the electronics application. Some transmitter (TX) circuits are serializer/deserializer (SERDES) TX circuits that can, for example, serialize differential data lines into a single, high-speed differential output, which can be fed through an equalizer (e.g., a finite impulse response (FIR) filter-based equalizer) that can shape the transmitted pulse to compensate for undesirable channel characteristics, such as frequency-dependent channel loss. High-performance processors and other applications often rely on very high data rates (e.g., 25 Gbps or higher), particularly when the data is serialized.

Achieving very high data rates can involve implementing vary fast clocking. However, very fast clock circuits can have undesirable operational characteristics, such as high power consumption and high complexity. Accordingly, some implementations use phased clocks to reduce power and complexity. For example, four clock signals can be generated by separate clocks ("quadrature clocks") at a same nominal frequency, separated from each other by 90-degrees, and combined to effectively generate four times the data rate of any of the clocks individually. Other implementations can use other numbers of clocks (e.g., two clocks separated by 180 degrees, six clocks separated by 60 degrees, etc.).

Slight differences between the multiple, separate, phased clocks (e.g., differences in their respective phase-locked loops, manufacturing variance, clock distribution, etc.) can cause deterministic jitter and/or other error in the combined clock output. For example, an output clock signal can be generated by combining phased input clock signals, and any difference between the input clock signals in pulse width, frequency, timing delay, etc. can cause the output clock signal to manifest phased clock error ("PCE"), such as inconsistent clock pulse width. Such PCE in "quadrature clocks" can be called "quadrature error," or "QE." When phased clocks are used in high performance applications, such as for a SERDES TX clock at very high data rates, the PCE (e.g., deterministic jitter or QE) can appreciably impact link performance.

Accordingly, among other things, embodiments described herein provide novel techniques for detecting and correcting such phased clock error. Some embodiments can convert phased input clock signals into unit interval (UI) clocks (e.g., four UI clock signals corresponding to four input quadrature clock signals) PCE can be detected by digitally sampling the UI clocks to characterize their respective clock pulse widths, and comparing the respective clock pulse widths. For example, any difference in clock pulse width greater than a predetermined threshold amount can be considered as PCE. Such an approach does not rely on assumptions of relationships between the phased clocks and can be applied for implementations with any suitable number of phased clock inputs.

For example, some conventional approaches assume strict differential relationships between the phased clocks, such assuming that a "phase 0" clock is perfectly opposite (out of phase) from a "phase 180," and a "phase 90" clock is perfectly opposite from a "phase 270" clock. Such conventional approaches can be limited, as distributing and maintaining such strict differential relationships can be very challenging. Further, any divergence from such strict differential relationships can affect PCE correction attempts.

Having detected PCE, some embodiments can correct for the detected PCE. For example, embodiments can generate a delay code used to select from a number of delay circuit paths according to the amount of detected PCE. The delay circuit path can be introduced in a UI clock generation path to shift UI clock pulse transitions, thereby adjusting clock pulse widths for the output clock to correct for the detected PCE. Techniques described herein can achieve PCE detection over a wide error range and can achieve error correction with small resolution.

Some embodiments include additional functionality. For example, embodiments permit PCE detection and/or correction with any suitable number of phased clock inputs (e.g., not only in context of quadrature clocks). Further, implementations permit various types of adjustments in detection sensitivity and/or other parameters. Further, some implementations include techniques for improving performance using voting and "ping-pong exiting."

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Figure 1:
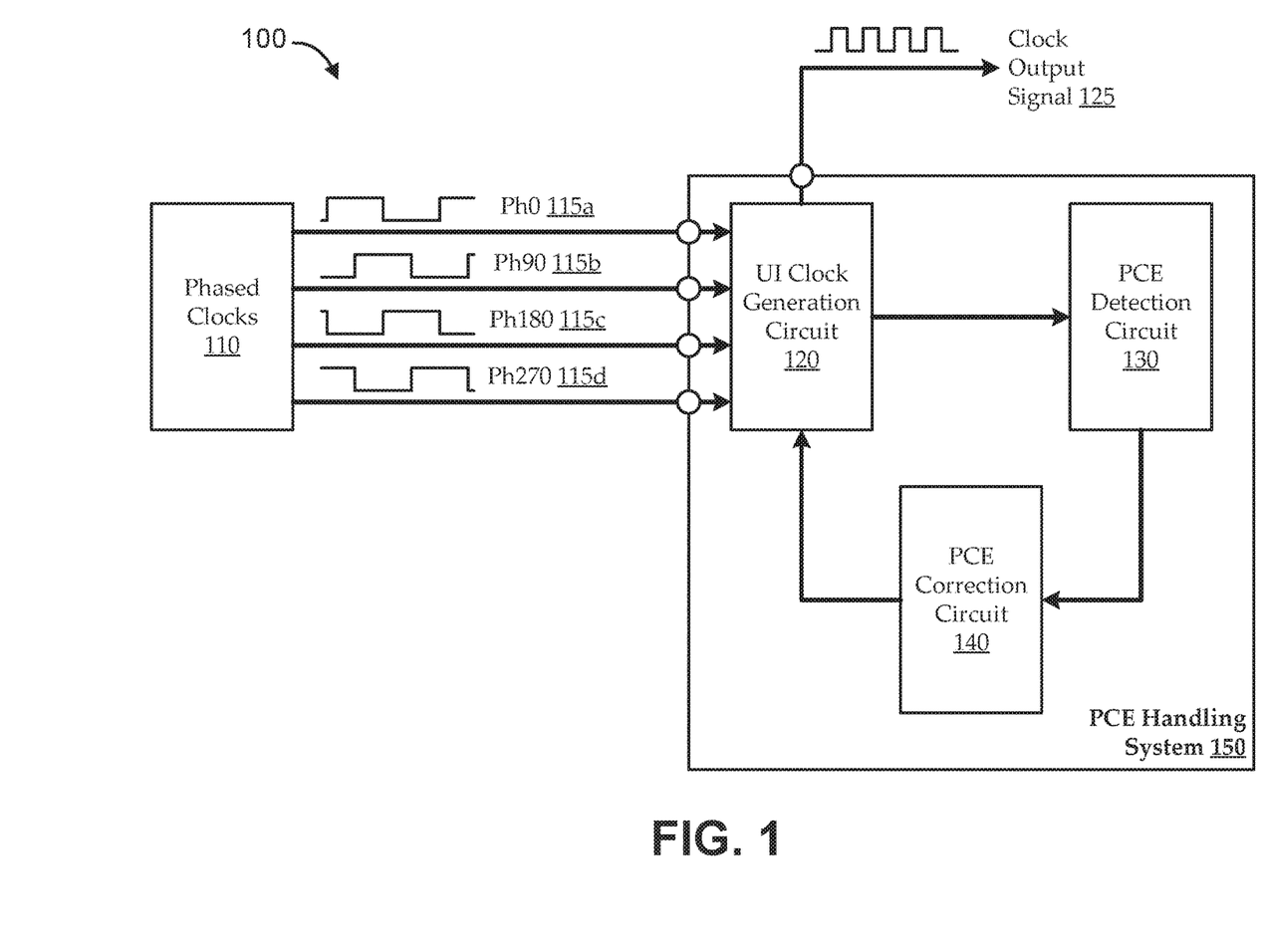
FIG. 1 shows a block diagram of an illustrative phased clocking system, according to various embodiments.

Turning first to FIG. 1, a block diagram is shown of an illustrative phased clocking system 100, according to various embodiments. The phased clocking system 100 includes a set of phased clocks 110 in communication with a phased clock error (PCE) handling system 150. Though not shown, embodiments of the phased clocking system 100 can be used with, and/or part of, a data transmission system, such as a transmitter of a SERDES system coupled with a data channel. In such implementations, the phased clocking system 100 can be used to generate clock output signal 125 for the transmitter to support a particular transmission data rate. As described above, the data rate facilitated by the phased clocking system 100 is typically appreciably faster than what would be supported by any of the phased clocks 110 individually. For example, with four phased clocks 110 as inputs (e.g., quadrature clocks), some implementations of the clock output signal 125 facilitate a data rate four times faster than that of the phased clocks 110.

While the phased clock handling system 100 is illustrated as a simplified functional block diagram to avoid overcomplicating the description and figures, these simplifications should not be construed as limiting embodiments and implementations. The phased clock system 100 can include fewer or additional components, and the various functional blocks can each be implemented as one or more discrete components, combined with other functional blocks into a single component, implemented in any suitable architecture or arrangement, etc. Further, each block described as a circuit can be implemented using any discrete analog, digital, and/or other circuitry, or in any other suitable manner.

The illustrated phased clocks 110 are implemented, so that each of N phased clock signals 115 is nominally at a same clock frequency, and each phased clock signal 115 is phase-shifted from its neighbors by 360/N degrees. For example, implementing the phased clocks 110 as quadrature clocks (i.e., N=4), as illustrated, the phased clock signals 115 are phase shifted by 90 degrees; so that there is a phased clock signal 115a with a reference (e.g., 0-degree) phase shift ("Ph0"), a phased clock signal 115b with a nominal 90-degree phase shift ("Ph90"), a phased clock signal 115c with a nominal 180-degree phase shift ("Ph180"), and a phased clock signal 115d with a nominal 270-degree phase shift ("Ph270"). In other implementations, N can be other suitable values, such as 6, 8, etc., and the nominal phase shifting can change accordingly.

While clocks and their signals are described herein as nominally operating at a particular frequency, phase, etc., real-world operation varies from those nominal values. For example, each phased clock 110 is implemented with particular clocking components (e.g., crystal oscillator, phase-lock loop, etc.), and there can be slight manufacturing variance between those same components in different ones of the phased clocks 110. Further, each phased clock 110 can be positioned slightly closer, or further, from a clock generator, or other components. These and/or other factors can cause variations in clock pulse widths, clock phase, etc., which can result in deterministic jitter and/or other types of phased clock error (PCE). Such PCE can impact link performance, particularly at high data rates. Some conventional clock generation systems use phased (e.g., quadrature) clock inputs, like the phased clocks 110 shown in FIG. 1, with little or no PCE handling. For example, some conventional clock generation systems assume strict relationships between the various phased clock signals 115, such as a strict 180-degree phase relationship between the Ph0 and Ph180 clocks (i.e., those clock signals are assumed to be strict complements).

Embodiments described herein include a PCE handling system 150 that can detect and/or correct PCE in generating a clock output signal 125. As shown, embodiments of the PCE handling system 150 can include a unit interval (UI) clock generation circuit 120, a PCE detection circuit 130, and a PCE correction circuit 140. Embodiments of the UI clock generation circuit 120 can include a number of phased clock inputs, each coupled with an output of a respective phased clock 110 (i.e., to receive a respective one of the phased clock signals 115) and a number of UI clock signal outputs. For example, the UI clock generation circuit 120 can generate N UI clock signal outputs from N phased clock signals 115. Implementations of the UI clock generation circuit 120 can also generate a clock output signal 125 from the UI clock signal outputs (e.g., effectively from PCE-corrected versions of the phased clock signals 115).

Embodiments of the PCE detection circuit 130 can include a UI clock selector coupled with the UI clock signal outputs, and a digital sampler having a selected UI clock input and a clock pulse width output. For example, the selected UI clock input of the digital sampler can receive each UI clock signal, in turn, as a selected one of the UI clock signal outputs, and can digitally sample the UI clock signals to determine their respective clock pulse widths. The PCE detection circuit 130 can also include a PCE output that indicates a detected PCE when clock pulse widths are determined to be different. For example, clock pulse widths can be compared for pairs of UI clock signals that share a clock edge (as explained more fully below). The PCE detection circuit 130 can consider there to be PCE when the compared clock pulse widths differ by more than a predetermined threshold amount (e.g., a guard band amount).

Having detected PCE by the PCE detection circuit 130, some embodiments of the PCE handling system 150 can correct some or all of the PCE using the PCE correction circuit 140. Embodiments of the PCE correction circuit 140 can introduce a delay into a UI clock generation path of the UI clock generation circuit 120, which can add delay (e.g., add phase shift) to one or more of the phased clock signals 115 from the perspective of the UI clock generation circuit 120. The added delay can be selectable (e.g., programmable). As described below, the added delay can effectively shift clock edges of the generated UI clock signals. This can, in turn, adjust the pulse widths of the generated clock output signal 125 to compensate for some or all of the PCE.

Figure 2:
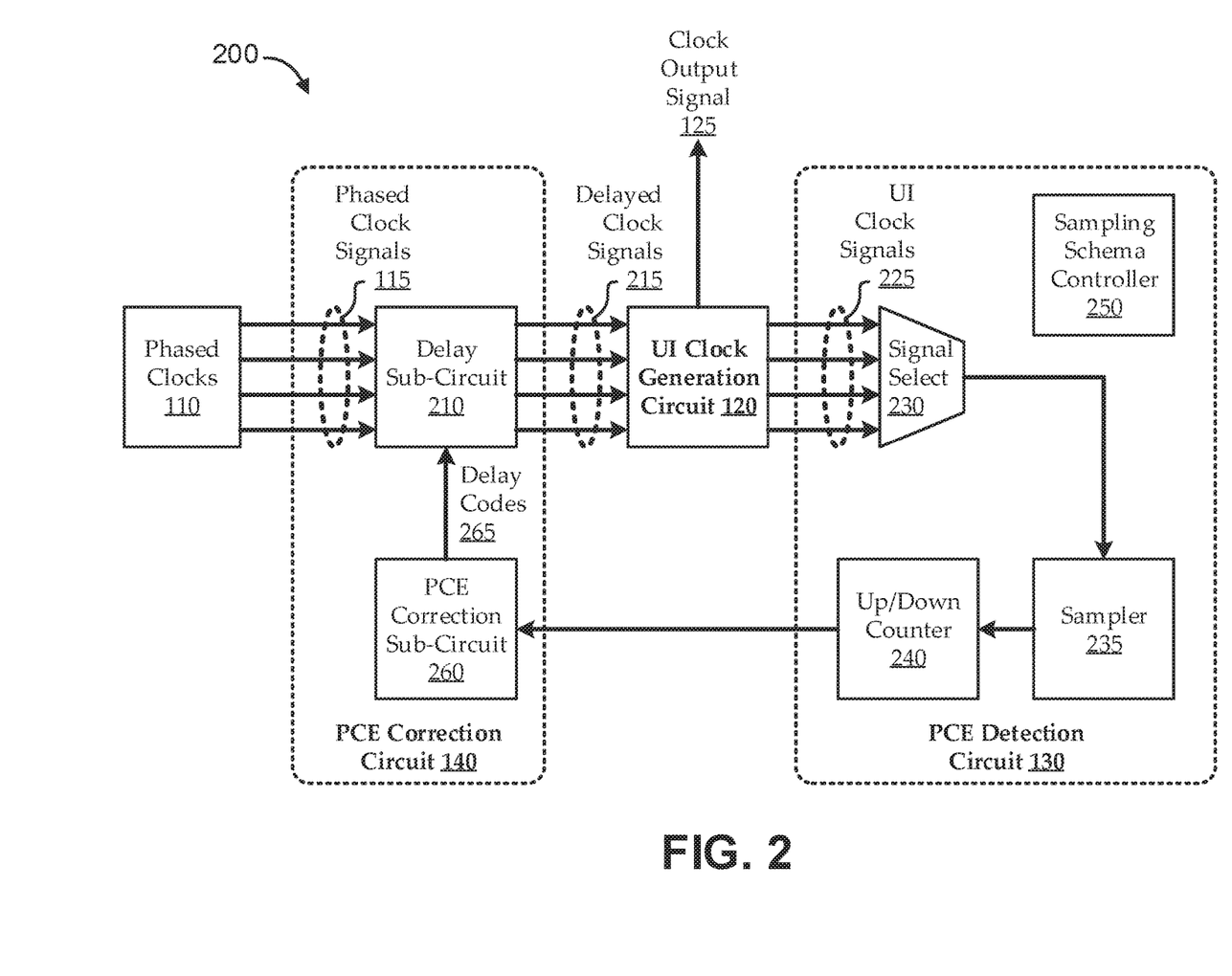
FIG. 2 shows another block diagram of an embodiment of a phased clock system, such as the ones described with reference to FIG. 1.

FIG. 2 shows another block diagram of an embodiment of a phased clock system 200, such as the ones described with reference to FIG. 1. As described above, a set of phased clocks 110 can output a plurality of phased clock signals 115. The phased clock signals 115 can be used by a UI clock generation circuit 120 to generate a clock output signal 125 (e.g., a SERDES TX clock signal). As illustrated, and as described more fully below, the PCE correction circuit 140 can output delayed clock signals 215 corresponding to the phased clock signals 115. Though referred to as "delayed," the delayed clock signals 215 can be corrected in any suitable manner (e.g., a particular delayed clock signal 215 can be identical to its corresponding phased clock signal 115, without any added delay). The UI clock generation circuit 120 can include any suitable components (e.g., circuitry) for converting the delayed clock signals 215 to the clock output signal 125.

Figure 3:
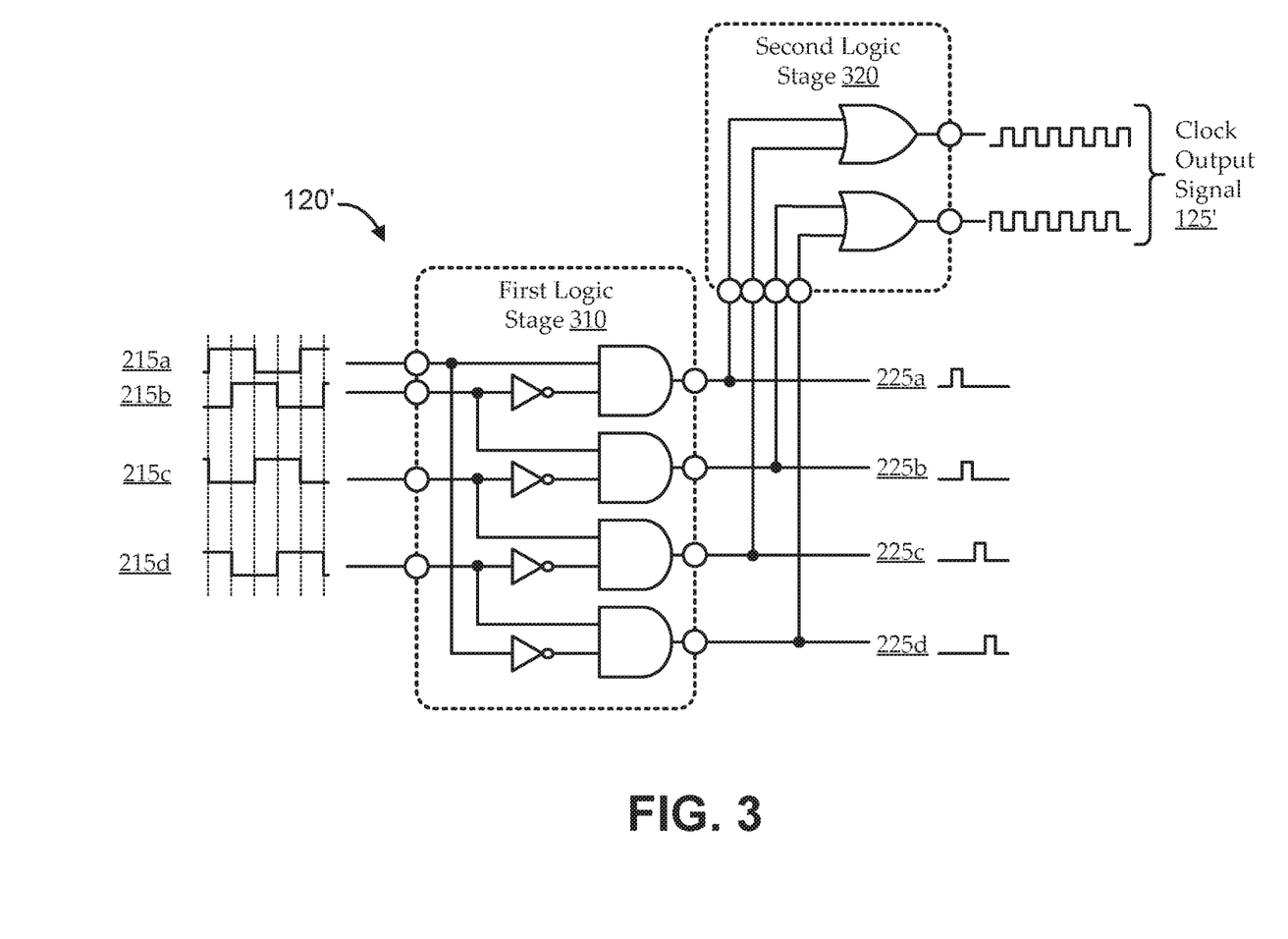
FIG. 3 shows one example of a UI clock generation circuit.

One example of such a UI clock generation circuit 120 is shown as UI clock generation circuit 120' in FIG. 3. The UI clock generation circuit 120' can generate a differential clock output signal 125 from four delayed clock signals 215 (corresponding to four phased clock signals 115 output from quadrature phased clocks 110, not shown). It can be assumed that each clock signal is substantially a square wave with a rising clock edge and a falling clock edge defining a clock pulse. It can be further assumed that the multiple signals 115 have a same nominal clock frequency, and that each is phase-shifted from its neighbors by 90 degrees, as illustrated.

A first logic stage 310 can receive pairs of the delayed clock signals 215 for conversion into respective UI clock signal outputs 225. For example, signal 215a and a complement of signal 215b can be received by an AND gate, so that a first output of a first AND gate is HIGH during only the portion of the clock pulse of signal 215a when signal 215b is LOW (e.g., approximately the first half of the clock pulse of signal 215a). The first output is shown as UI clock signal output 225a. In a similar manner, a second UI clock signal output 225b can be generated from signal 215b and the complement of signal 215c, a third UI clock signal output 225c can be generated from signal 215c and the complement of signal 215d, and a fourth UI clock signal output 225d can be generated from signal 215d and the complement of signal 215a.

As shown, the resulting UI clock signal outputs 225 are phase-shifted according to the phase shifting of the input delayed clock signals 215 (e.g., by 90 degrees in a quadrature implementation. Further, each resulting UI clock signal output shares clock pulse edges with its neighbors. For example, the falling edge of UI clock signal output 225a is logically tied (i.e., as a result of the method of generation) to the rising edge of UI clock signal output 225b.

Some implementations include a second logic stage 320 for generating the clock output signal 125" from the UI clock signal outputs 225. The clock output signal 125' can be generated using a number of different techniques. The illustrated technique uses OR gates to create differential clock output signals, each from a respective 180-degree out-of-phase pair of the UI clock signal outputs 225. For example, one of the differential signals is generated from UI clock signal outputs 225a and 225c, and the complementary differential signal is generated from UI clock signal outputs 225c and 225d. In this way, the clock output signal 125 can support a data rate that is four times faster than each of the phased clocks 110 (not shown).

Turning back to FIG. 2, the UI clock signal outputs 225 generated by the UI clock generation circuit 120 (e.g., by the circuit described with reference to FIG. 2) can be passed to a PCE detection circuit 130 to determine whether there is deterministic jitter or other phased clock error. Embodiments of the PCE detection circuit 130 can include a UI clock selector 230, a digital sampler 235, and an up/down counter 240. The UI clock selector 230 can select one of the UI clock signal outputs 225, according to a selection schema. The digital sampler 235 and the up/down counter 240 can determine a clock pulse width of the selected UI clock signal output 225. For example, the digital sampler can obtain a predetermined number of samples of the selected UI clock signal output 225, and the up/down counter 240 can increment or decrement a counter each time the sample indicates that the UI clock signal output 225 is HIGH (or, alternatively, each time the sample indicates that the UI clock signal output 225 is LOW).

Figure 4:
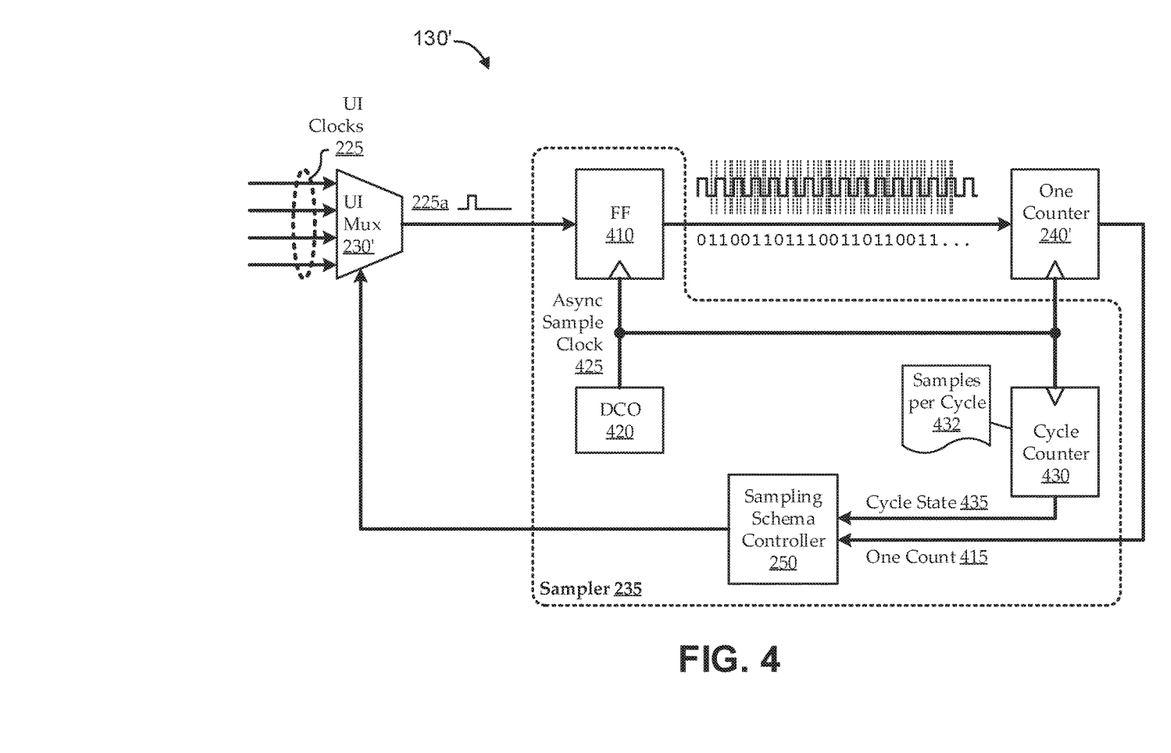
FIG. 4 shows a block diagram of an embodiment of a phased clock error (PCE) detection circuit.

For the sake of illustration, FIG. 4 shows a block diagram of an embodiment of a PCE detection circuit 130. The UI clock selector 230 is shown as a multiplexer (MUX) 230' that selects from among the UI clock signal outputs 225 and outputs a selected one of the UI clock signal outputs 225 (e.g., UI clock signal output 225a, as shown). The digital sampler 235 can include a flip-flop 410, or any other suitable digital sampling component. The flip-flop 410 can be clocked by any suitable type of sampling clock running at a high enough rate to collect useful sampling data from the selected UI clock signal output 225. In the illustrated implementation, the clock is an asynchronous sample clock 425 generated by a digitally controlled oscillator (DCO) 420. In one implementation, the DCO is implemented with multiple (e.g., seven) different frequency-simple CMOS ring oscillators, and a 3-bit linear frequency feedback shifter to rotate through the multiple frequencies. Such an approach can effectively ensure that the sampling times are determined in a manner that is asynchronous with the UI clock signal outputs 225. Other sample clock generation can be used in other implementations, for example, where there is an extremely low likelihood that the sampling will accidentally be synchronous with the UI clock signal outputs 225.

Some embodiments of the digital sampler 235 further include a cycle counter 430 that governs a number of samples used for pulse width determination. In some implementations, the cycle counter 430 is programmable with a particular number of samples per cycle 432 (i.e., per sampling cycle). For example, the cycle counter 430 can be hard-wired, programmed, or otherwise configured to count 100,000 samples in each sampling cycle. In some implementations, the cycle counter 430 can output a cycle state signal 435, or any other suitable indication of when the number of samples per cycle 432 has been reached. In other implementations, the cycle counter can be a timer, or any other suitable component for helping to ensure that different pulse width determinations in different cycles are comparable.

Each time the flip-flop 410 is clocked, its output can be a sample of the selected UI clock signal output 225. An up/down counter 240 can be implemented as one counter 240', or in any other suitable manner, to track the number of samples indicating "HIGH" (or "LOW" in other implementations). At the completion of a sampling cycle (e.g., a number of samples governed by the cycle counter 430), the one counter 240' can effectively have a total count of a number of HIGH samples, shown as a "one count" 415. The one count 415 can be considered an indication of the pulse width of the selected UI clock signal output 225. For example, the one count 415 divided by the number of samples per cycle 432 can be approximately the duty cycle of the signal.

The sampling cycle described above can be part of a sampling schema governed by a sampling schema controller 250. For example, in a first sampling cycle, the sampling schema controller 250 can direct the MUX 230' to select a first UI clock signal output 225a; and the one counter 240' can increment (count up) for every HIGH sample obtained from the selected first UI clock signal output 225a. In a second sampling cycle, the sampling schema controller 250 can direct the MUX 230' to select a second UI clock signal output 225b; and the one counter 240' can decrement (count down) for every HIGH sample obtained from the selected second UI clock signal output 225b. If the clock pulse widths of the first and second UI clock signal outputs 225a, 225b are identical, it can be expected that the resulting one count 415 after the two sampling cycles will be zero (i.e., the one counter 240' would have decremented in the second cycle by the same amount that it incremented in the first cycle). In contrast, a non-zero final one count 415 can indicate potential PCE.

In practice, the final count may not be zero, for example, because of sampling variations, when the pulse width differences are smaller than a design tolerance, etc. Accordingly, some implementations include a guard band, or threshold, within which there is not considered to be PCE; the pulse widths are considered close enough. For example, the threshold may be approximately one percent of the number of samples per cycle 432, 0.1 percent of the number of samples per cycle 432, or any other suitable number. In some implementations, the threshold is programmable.

As one example, the one counter 240' can be implemented as a 23-bit counter. The most significant bit can be used to set a non-zero base number, which can effectively account for "negative" final one counts 415. For example, if the one counter 240' decrements in the second cycle by more than it incremented in the first cycle, the final count would be less than the base number. The number of samples per cycle 432 can be set to one million, and the threshold can be set to one thousand. If the final one count 415 exceeds the base number by more than the threshold (e.g., "final one count 415">'10000000000001111101000'), this indicates that the clock pulse width of the first UI clock signal output 225a is larger than that of the second UI clock signal output 225b by a large enough amount to be considered as PCE. Similarly, if the final one count 415 is less than the base number by more than the threshold (e.g., "final one count 415"<'01111111111110000011000'), this indicates that the clock pulse width of the second UI clock signal output 225b is larger than that of the first UI clock signal output 225*a* by a large enough amount to be considered as PCE.

Returning to FIG. 2, embodiments of the PCE correction circuit 140 can correct (e.g., compensate for) some or all of the PCE detected by the PCE detection circuit 130 by effectively causing a shifting of shared clock pulse edges, as appropriate. As illustrated, embodiments of the PCE correction circuit 140 can include a PCE correction sub-circuit 260 and a delay sub-circuit 210. In some implementations, the PCE detection circuit 130 (e.g., the sampling schema controller 250) can output an indication of PCE associated with one or more of the UI clock signal outputs 225. In response to the indication, the PCE correction sub-circuit 260 can generate a delay code 265, which can be used by the delay sub-circuit 210 to select a delay to add to one or more of the phased clock signals 115. The resulting delayed clock signals 215 can then be provided to the UI clock generation circuit 120 for generation of the UI clock signal outputs 225 and the clock output signal 125.

For example, as described above, the UI clock signal outputs 225 are generated, so that the first and second UI clock signal outputs 225*a*, 225*b* share a clock pulse edge (i.e., the falling edge of signal output 225*a* is in the same location as the rising edge of signal output 225*b*); the second and third UI clock signal outputs 225*b*, 225*c* share a clock pulse edge; the third and fourth UI clock signal outputs 225*c*, 225*d* share a clock pulse edge; and the fourth and first UI clock signal outputs 225*d*, 225*a* share a clock pulse edge. As such, moving any of the shared clock pulse edges will cause one signal output's pulse width to increase, and another signal output's pulse width to decrease by a same amount. For example, if the clock pulse width of the first UI clock signal output 225*a* is determined to be larger than that of the second UI clock signal output 225*b* by a large enough amount to be considered as PCE, embodiments can compensate for at least some of the PCE by effectively shifting their shared clock pulse edge to the left (i.e., decreasing the first signal output's pulse width and increasing the second signal output's pulse width). Embodiments of the PCE correction circuit 140 can cause this shifting by shifting the second phased clock signal 115*b* to the left or right (e.g., or, alternatively, by shifting the first phased clock signal 115*a* to the left or right). For example, using the UI clock generation circuit 120' of FIG. 3 with the shifted first phased clock signal 215 would generate a first UI clock signal output 225 with a smaller pulse width.

The PCE correction sub-circuit 260 can generate the delay codes 265 in any suitable manner. In one implementation, the delay sub-circuit 210 includes a selectable set of delay paths associated with each of the phased clock signals 115. The PCE correction sub-circuit 260 can iteratively increment the delay code 265 for any of the selectable sets of delay paths, as needed, until PCE detected from a particular pair of UI clock signal outputs 225 is apparently corrected.

Figure 5:
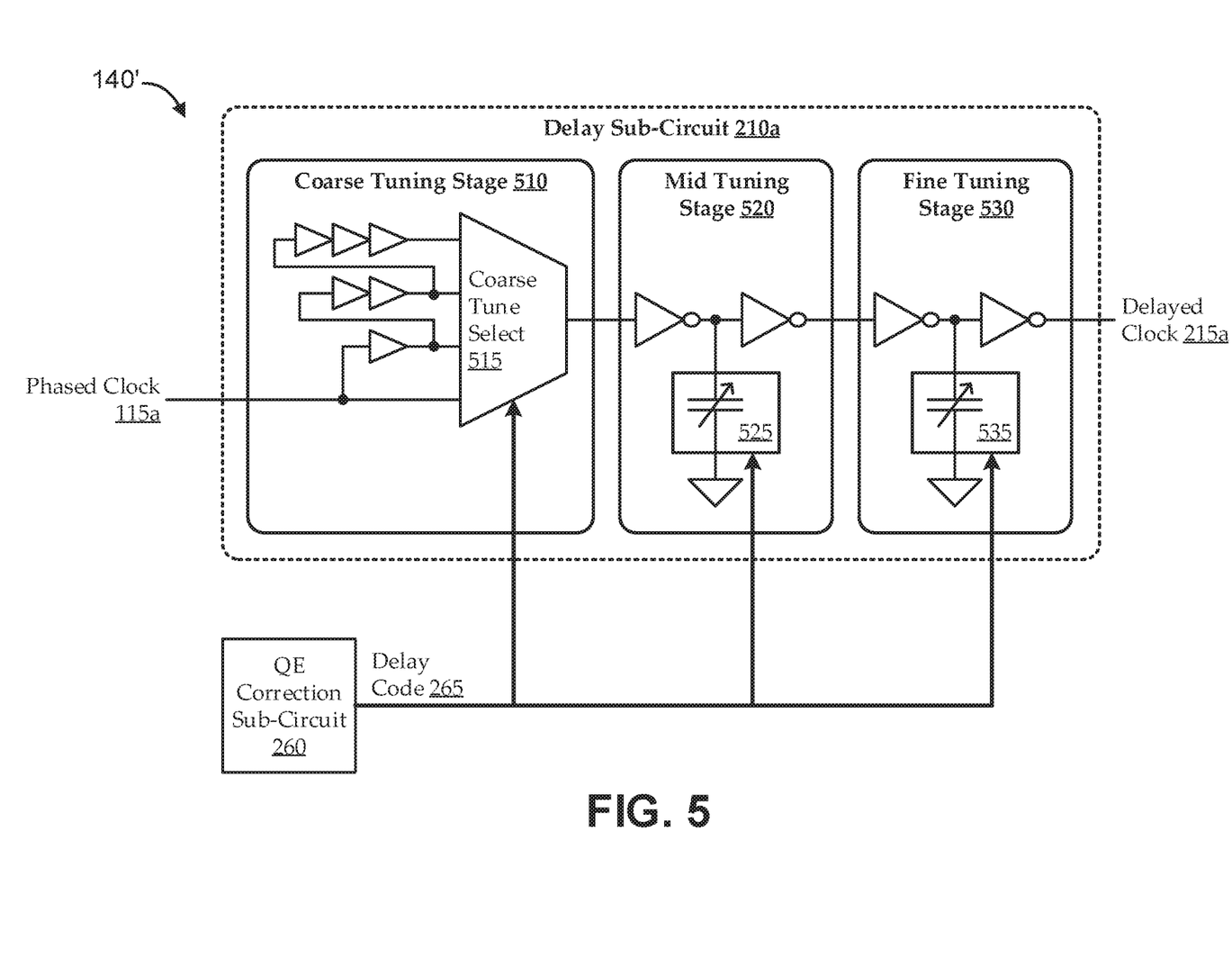
FIG. 5 shows a circuit block diagram of an embodiment of a partial PCE correction circuit.

For the sake of illustration, FIG. 5 shows a circuit block diagram of an embodiment of a partial PCE correction circuit 140'. The illustrated PCE correction circuit 140' includes the PCE correction sub-circuit 260 and one instance of a delay sub-circuit 210*a*. Though only one instance of the delay sub-circuit 210*a* is shown to avoid overcomplicating the drawing, implementations can include one or more instances of the delay sub-circuit 210*a* in line with each of the phased clock signals 115 (e.g., four instances for a quadrature implementation). As described above, the PCE correction sub-circuit 260 can generate a delay code 265 (e.g., for each instance of the delay sub-circuit 210*a*; with different portions for different instances of the delay sub-circuit 210*a*; etc.), and the delay code 265 can select from among multiple delay paths.

In the illustrated implementation, the delay sub-circuit 210*a* includes three tuning stages, a coarse tuning stage 510, a mid tuning stage 520, and a fine tuning stage 530. The illustrated coarse tuning stage 510 includes four delay paths coupled with inputs to a coarse tune selector 515 (e.g., a multiplexer). The delay paths include zero, one, two, and three delay elements, respectively. The coarse tune selector 515 can be programmed, according to particular bits of the delay code 265, to select between the delay paths. The output of the coarse tuning stage 510 (i.e., of the coarse tune selector 515) can be used as the input to the mid tuning stage 520, and the output of the mid tuning stage 520 can be used as the input to the fine tuning stage 530. Each of the mid tuning stage 520 and the fine tuning stage 530 can include a respective delay that is adjustable according to a digitally controlled variable capacitance (more capacitance can slow ramp-up time, which can effectively create delay). For example, as shown for each of the mid tuning stage 520 and the fine tuning stage 530, the signal path can pass through a pair of inverters coupled to a ground-connected adjustable capacitance. The mid tuning stage 520 can have a first capacitor bank 525 programmable according to certain bits of the delay code 265, and the fine tuning stage 530 can have a second capacitor bank 535 programmable according to other bits of the delay code 265. The output of the fine tuning stage 530 can be the delayed clock signal 215*a*, which is a delayed version of the input phased clock signal 115*a*.

Figure 6:
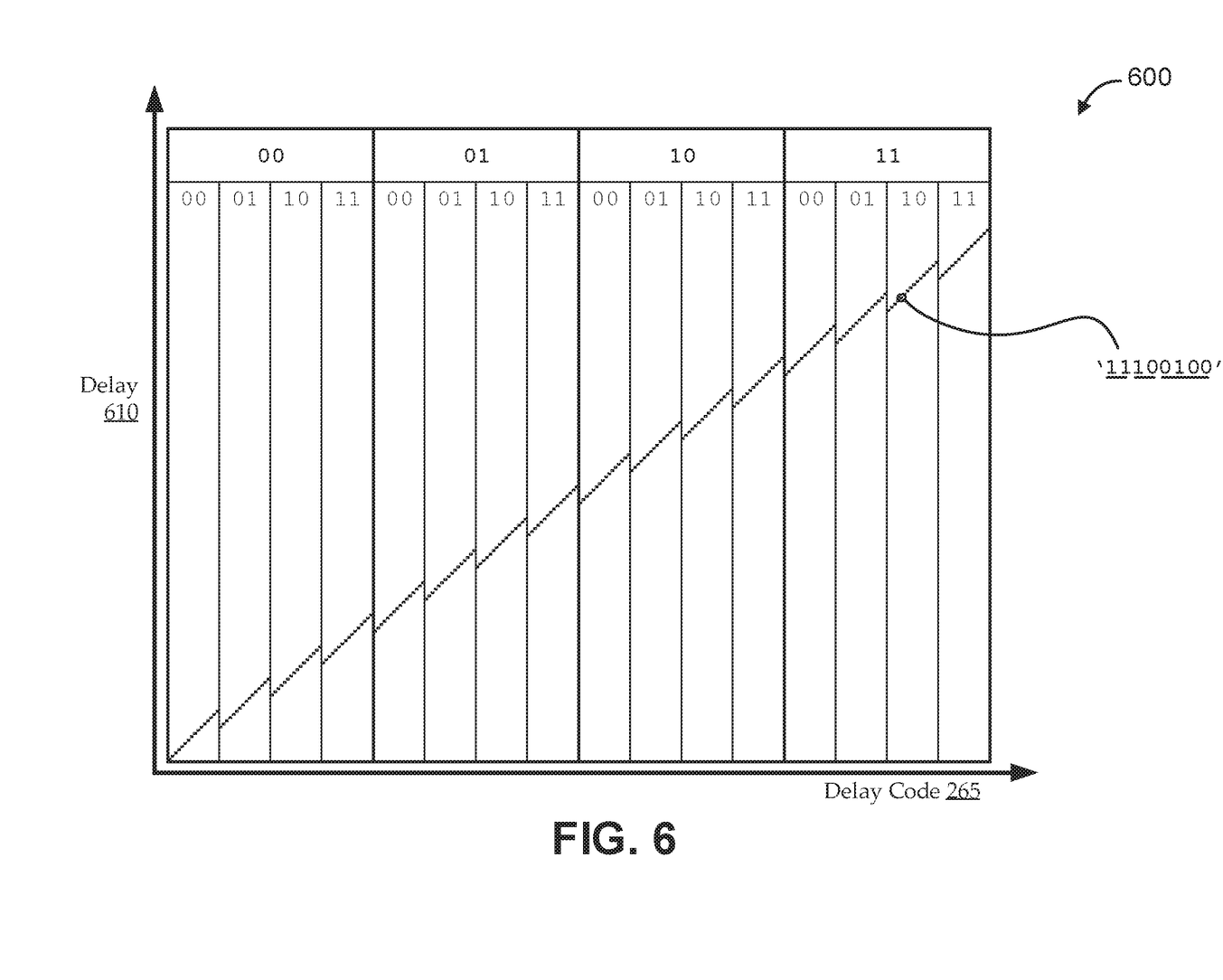
FIG. 6 shows a graph of an illustrative approach for using delay codes to program a wide range of delays into a delay sub-circuit, like the one described in FIG. 5.

FIG. 6 shows a graph 600 of an illustrative approach for using delay codes 625 to program a wide range of delays 610 into a delay sub-circuit 210, like the one described in FIG. 5. As illustrated, the delay code 265 can be an eight-bit code, where the two most significant bits are used to set the coarse tuning stage 510, the two next-most significant bits are used to set the mid tuning stage 520, and the four least significant bits are used to set the fine tuning stage 530. Using such a delay code 265, there can be four possible settings for the coarse tuning stage 510 (illustrated as four regions spanning the entire graph 600, each surrounded by a thicker rectangle). Within each coarse tuning stage 510 setting, there can be four possible settings for the mid tuning stage 520 (illustrated as four regions spanning each coarse tuning stage 510 region, each surrounded by a thinner rectangle). Within each mid tuning stage 520 setting, there can be sixteen settings for the fine tuning stage 530 (illustrated as sixteen delay 610 levels within each mid tuning stage 520 region). As such, the illustrated delay code 265 can provide 256 delay levels, though some levels overlap to ensure no gaps in fine tuning stage 530 settings. For example, each fine tuning stage 530 setting can add approximately 0.5 picoseconds of delay, so that 256 settings (with some overlap) can provide a total range of approximately 30 picoseconds of delay.

The number of delay stages, techniques used by each delay stage to add delay, delay code 265 schema, and other techniques described in FIGS. 5 and 6 are intended only as examples and are not intended to be limiting. For example, more or fewer numbers of steps can be realized using more or fewer bits in the delay codes 265 and/or using more or less delay. Further, the total range and/or resolution of the delay can be adjusted in any suitable manner, for example, by selecting different capacitor values, different numbers of delay elements and/or stages, etc.

The above description provides techniques for detecting PCE according to pulse-width differences between pairs of UI clock signal outputs 225, and for correcting at least some of the PCE by adding delay to one or more phased clock signals 115. Embodiments can use these techniques iteratively to correct for some or all of the PCE detected across some or all of the phased clock signals 115, thereby outputting a clock output signal 125 with little or no PCE.

Returning again to FIG. 2, embodiments of the sampling schema controller 250 (e.g., a dedicated control circuit, a functional control block of a more central processor, etc.) can govern a higher level schema for correcting PCE. In one embodiment, the schema begins by detecting and correcting PCE with regard to phased clock signals 115a and 115b (Ph0 and Ph90). For example, the sampling schema controller 250 directs the UI clock selector 230 to select the first delayed clock signal 215a, the PCE detection circuit 130 determines a first pulse width indication, the sampling schema controller 250 directs the UI clock selector 230 to select the second delayed clock signal 215b, the PCE detection circuit 130 determines a second pulse width indication, and the PCE detection circuit 130 outputs an indication (e.g., a final one count) to the PCE correction circuit 140 of a pulse width difference. If the difference is greater than the predetermined guard band (threshold), the PCE correction circuit 140 can shift the second phased clock signal 115b right or left by incrementing the delay code 265 associated with the second phased clock signal 115b (additionally, or alternatively, the first phased clock signal 115a can be shifted similarly; the delay code 265 can be decreased; etc.). The detection and correction can be repeated until the pulse widths of the first and second phased clock signals 115a, 115b are equal (or at least within the guard band tolerance). The can be referred to as "equaling" the first and second phased clock signals 115a, 115b.

Once the first and second phased clock signals 115a, 115b are equaled, the same process can be used for equaling the other phased clock signals 115. For example, the order can include equaling the first and second phased clock signals 115a, 115b; then equaling the third and fourth phased clock signals 115c, 115d; then equaling the second and third phased clock signals 115b, 115c; then equaling the first and fourth phased clock signals 115a, 115d. Any suitable order can be used. However, there can be a benefit to having each phased clock signal 115 invoked in each round of equaling (e.g., it can be less desirable to perform the equaling with an order, such as first 115a and second 115b, followed by second 115b and third 115c, followed by third 115c and fourth 115d, etc.). Some implementations perform some or all of the equaling in series, so that a same set of components (e.g., gates) can be used for all the equaling processes, thereby mitigating potential skew, etc. Alternative implementations can perform some or all of the equaling in parallel. Further, other implementations can use any suitable schema for equaling various pairs of phased clock signals 115 (e.g., by determining whether, and by how much, to delay them relative to each other).

Such PCE detection and correction techniques can be applied at any suitable time. In some embodiments, PCE detection and/or correction techniques described herein can be performed as part of a start-up sequence for a microprocessor or other computational environment (e.g., at each power-up). In other embodiments, PCE detection and/or correction techniques described herein can be performed in response to a trigger event. For example, the trigger event can be a particular time (e.g., according to a schedule, after some elapsed time since the last PCE correction, etc.), in response to a monitoring event (e.g., data errors, or the like, indicating possible PCE in the transmission clock, etc.), and/or any other suitable trigger.

In some embodiments, the sampling schema controller 250 (or any other suitable component) can include additional schema features. As described above, an "equaling" process can be considered as complete when two clock signals are determined to have pulse widths that are equal within the predetermined guard band tolerance. In some sampling schemas, the equaling process is considered complete only after V (e.g., three) consecutive determinations that the clock signals have pulse widths that are equal within the predetermined guard band tolerance. For example, it can be demonstrated (for a particular implementation like the one in FIGS. 5 and 6) that the probability of setting a code, where the resulting delayed clock signals 215 will still have a pulse width difference of 0.5 picoseconds, is approximately 2.9 percent when V is one (i.e., a single "equal" vote). When V is three (i.e., three "equal" votes), the probability of such a 0.5 picosecond error drops to roughly 0.00092 percent.

Other embodiments include an additional schema feature of a "ping-pong exit" mechanism. As described above, the equaling process can include a number of iterations, each resulting in shifting one of the clock signals left or right. In some instances, the process can potentially become stuck by repeatedly "ping-ponging"-shifting the same signal right, then left, then right, and so on. The ping-pong exit mechanism can automatically exit the equaling process whenever a predetermined number of ping-pongs (e.g., three) is detected.

Figure 7:
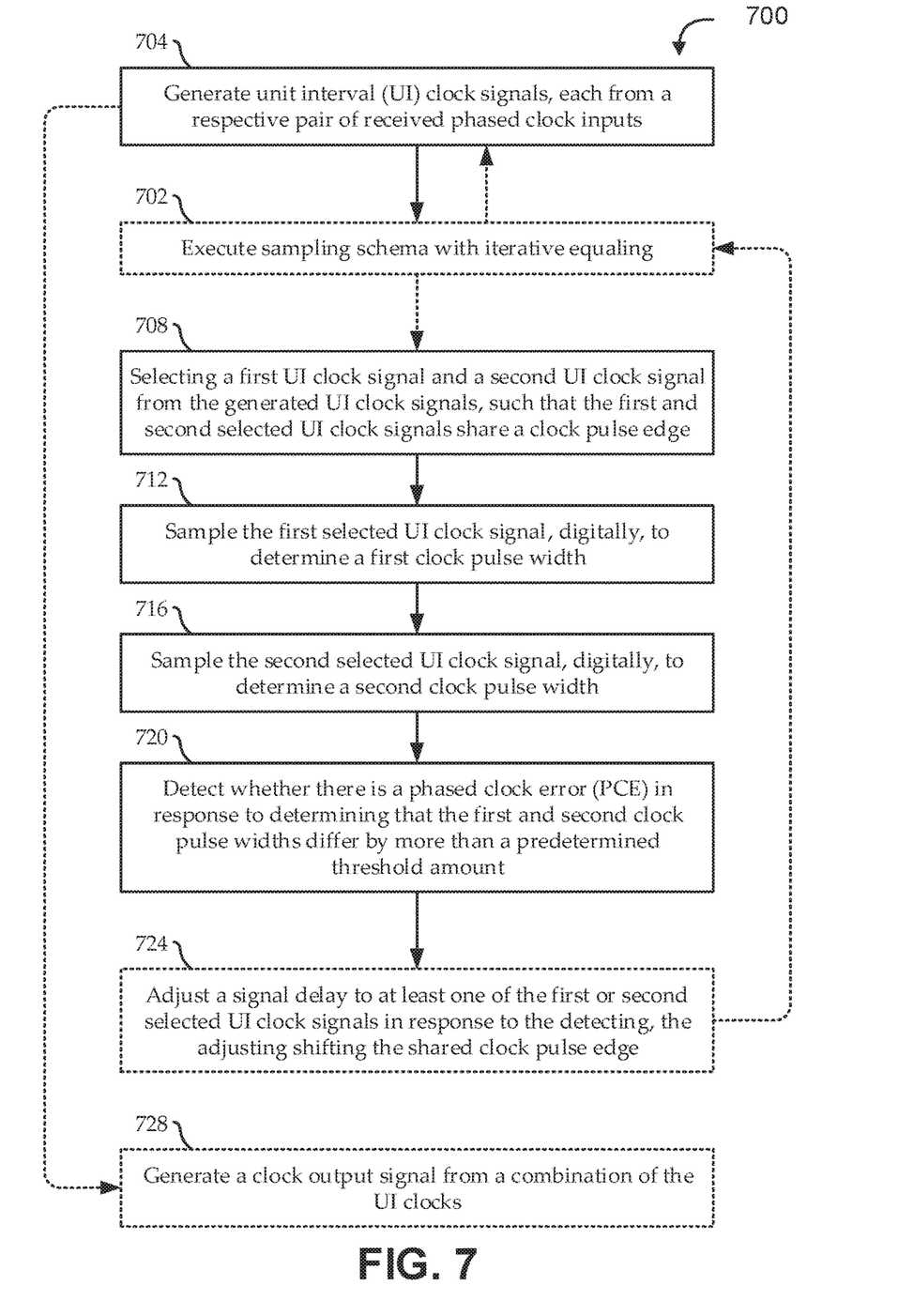
FIG. 7 shows a flow diagram of an illustrative method for PCE detection and/or correction, according to various embodiments.

FIG. 7 shows a flow diagram of an illustrative method 700 for phased clock error (PCE) detection and/or correction, according to various embodiments. The method 700 can be implemented using any of the systems described above, or any other suitable systems. Embodiments of the method 700 begin at stage 704 by generating multiple unit interval (UI) clock signals, each from a respective pair of a received plurality of phased clock inputs. For example, the phased clock inputs can be quadrature clock signals and/or any N clock signals that have the same nominal clock frequency and are phase shifted from each other by 360/N degrees (e.g., for quadrature clocks, N is four, and the clock signals are nominally at 0, 90, 180, and 270 degrees, respectively). In some implementations, N UI clock signals are generated from the N phased clock inputs, for example, by using respective pairs of adjacent phased clock signals to generate each UI clock signals (e.g., Ph0 AND NOT(Ph90) is used to generate a first UI clock signal, Ph90 AND NOT(Ph180) is used to generate a second UI clock signal, etc.).

At stage 708, embodiments can select a first UI clock signal and a second UI clock signal from the generated UI clock signals, such that the first and second selected UI clock signals share a clock pulse edge. For example, the selected UI clock signals are adjacent, such that the rising edge of one is the falling edge of the other. At stage 712, the first selected UI clock signal can be digitally sampled to determine a first clock pulse width; and, at stage 716, the second selected UI clock signal can be digitally sampled to determine a second clock pulse width.

At stage 720, embodiments can detect whether there is PCE in response to determining that the first and second clock pulse widths differ by more than a predetermined threshold amount. For example, as described above, the digital sampling (at stages 712 and 716) can involve incrementing and/or decrementing an up/down counter, or the like. In one implementation, the pulse width of the first UI clock signal can be characterized by incrementing a counter for each of a number of samples of the first selected UI clock signal indicating a logical HIGH (i.e., the ratio of HIGH samples to total samples can indicate the average duty cycle, which can indicate the pulse width); and the pulse width of the second UI clock signal can be characterized by decrementing the counter for each of a number of samples of the second selected UI clock signal indicating a logical HIGH. The detecting at stage 720 can involve determining whether the counter, after sampling the second selected UI clock signal at stage 716, indicates a value that falls outside a guard band tolerance corresponding to the predetermined threshold amount. For example, after taking a million samples of the first UI clock signal during which the counter is incremented for HIGH values, and after taking a million samples of the second UI clock signal during which the counter is decremented for HIGH values, the counter shows a value of X. If the guard band tolerance is ±Y, and |X|>Y, PCE is considered detected.

Some embodiments of the method continue by correcting the detected PCE. For example, at stage 724, embodiments can adjust a signal delay to at least one of the first or second selected UI clock signals in response to the detecting. The adjusting is performed in such a way that shifts the shared clock pulse edge (e.g., to the left or right), for example, by delaying one of the first or second selected UI clocks. For example, the adjusting can involve selecting one of multiple delay circuit paths according to the detecting, and coupling the selected delay circuit path with at least one of the phased clock inputs (i.e., to slightly adjust the phase of one of the phase clock signals being used to generate one of the UI clock signals). Such an approach can further involve generating a delay code according to the detecting, and selecting the delay circuit path according to the delay code.

In some embodiments, stages 708-724 are part of a larger sampling schema for PCE detection and correction using iterative equaling, as indicated by stage 702. For example, the sampling schema can select pairs of UI clock signals, according to a predefined schema (e.g., order, pattern, etc.), and can iteratively "equal" the clock pulse widths of that selected pair by stages 708-724. In one implementation, an equaling process can involve iteratively performing the selecting (stage 708), the first sampling (stage 712), the second sampling (stage 716), the detecting (stage 720), and the adjusting (stage 724) until the detecting (stage 720) determines that the first and second clock pulse widths do not differ by more than the predetermined threshold amount (i.e., that the UI clock pulse widths are "equal"). In some implementations, determining that the pulse widths are equal can involve achieving an "equal" result for a predetermined number (V) of iterations (e.g., three) in a row. Some implementations can alternatively make an "equal" determination whenever there is a predetermined number (P) of "ping-pongs" in a row (e.g., a shifting of the shared clock pulse edge right in one iteration followed by a shifting of the shared clock pulse edge left in a next iteration). In some implementations, the PCE can be considered as corrected when all the UI clocks have gone through the equaling process, so that all have pulse widths that are equal (at least within the guard band tolerance).

In some embodiments, at stage 728, a clock output signal can be generated from a combination of the plurality of UI clocks. For example, the clock signal can be continuously generated from the UI clocks as the UI clocks are continuously generated from the phased clocks. As the UI clocks are adjusted based on the PCE detection and correction, clock output signal is similarly corrected for PCE. In some embodiments, the generated clock output signal can be used as a SERDES transmit clock, or in any other suitable context.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The steps of a method or algorithm or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A phased clock error handling system comprising:
a unit interval (UI) clock circuit comprising:
N phased clock inputs, each coupled with an output of a respective one of a plurality of phased clocks; and
N UI clock signal outputs, each comprising a respective 1/N duty cycle pulse signal generated from a respective pair of the phased clock inputs by logically combining one of the respective pair with a complement of the other of the respective pair, the respective pair being phase-delayed each from the other by 360/N degrees,
such that any Mth UI clock signal output of the N UI clock signal outputs is offset from any (M+1)st UI clock signal output of the N UI clock signal outputs by 360/N degrees and each falling edge of the respective pulse signal of the Mth UI clock signal output is coincident with each rising edge of the respective pulse signal of the (M+1)st UI clock signal output, where M is an integer; and
a phased clock error (PCE) detector circuit comprising:
a UI clock selector coupled with the N UI clock signal outputs;
a digital sampler having a selected UI clock input and a clock pulse width output, the selected UI clock input coupled with the UI clock selector to receive a selected one of the N UI clock signal outputs; and
a PCE output that indicates a detected PCE when a first clock pulse width differs from a second clock pulse width by more than a predetermined threshold amount, wherein the first clock pulse width is received from the clock pulse width output in response to asynchronously digitally sampling the Mth UI clock signal output, and the second clock pulse width is received from the clock pulse width output in response to asynchronously digitally sampling the (M+1)st UI clock signal output.

2. The system of claim 1, wherein the PCE detector circuit further comprises:
an up/down counter having a sample input coupled with the clock pulse width output, and a count output coupled with the PCE output,
wherein, after digitally sampling the Mth UI clock signal output, the count output represents a value associated with the first clock pulse width,
wherein, after digitally sampling the (M+1)st UI clock signal output, the count output represents a value associated with a difference between the first clock pulse width and the second clock pulse width, and
wherein the PCE output indicates the detected PCE when the count output represents a value that falls outside a guard band tolerance corresponding to the predetermined threshold amount.

3. The system of claim 1, wherein the PCE detector circuit further comprises:
a sampling schema controller having a schema output coupled with the UI clock selector, and a schema input coupled with the PCE output, such that the N UI clock signal outputs are selectable by the sampling schema controller according to the PCE output.

4. The system of claim 1, further comprising:
a PCE correction circuit comprising a plurality of selectable delay circuit paths selected according to the PCE output, such that the selected delay circuit path introduces signal delay to the UI clock circuit, thereby shifting the coincident rising and falling edges of the N UI clock signal outputs.

5. The system of claim 4, wherein the PCE correction circuit comprises:
a PCE correction sub-circuit having:
a detect input coupled with the PCE output; and
a delay code output coupled with the plurality of selectable delay circuit paths,
wherein the plurality of selectable delay circuit paths is selectable according to the delay code output.

6. The system of claim 4, wherein the PCE correction circuit comprises:
a first delay stage comprising a multiplexer having a plurality of first-stage inputs, each coupled with a different respective number of delay elements, a first select input, and a first-stage output that is a selected one of the multiplexer inputs according to the first select input.

7. The system of claim 6, wherein the PCE correction circuit further comprises:
a second delay stage comprising a variable capacitance having a second-stage input coupled with the first-stage output, a second select input, and a second-stage output that is a capacitively delayed version of the second-stage input according to a capacitance selected by the second select input.

8. The system of claim 1, wherein:
the UI clock circuit further comprises N sub-circuits, each having:
a first sub-circuit input coupled to a respective first of the N phased clock inputs,
a second sub-circuit input coupled to a respective second of the N phased clock inputs, and
a respective one of the N UI clock signal outputs, the UI clock signal output being HIGH only when the first sub-circuit input is HIGH and the second sub-circuit input is LOW.

9. The system of claim 1, further comprising:
a clock output circuit coupled with the N UI clock signal outputs and having a clock signal output generated from a combination of the N UI clock signal outputs.

10. The system of claim 9, wherein:
each of the N phased clock inputs is at a first data rate; and
each of the N UI clock signal outputs is at a second data rate that is N times the first data rate.

11. A method for phased clock error handling, the method comprising:
generating N unit interval (UI) clock signals, each from a respective pair of N received phased clock inputs, to have a respective 1/N duty cycle pulse signal generated by logically combining one of the respective pair with a complement of the other of the respective pair, the respective pair being phase-delayed each from the other by 360/N degrees,
such that any Mth UI clock signal of the N UI clock signals is offset from any (M+1)st UI clock signal of the N UI clock signals by 360/N degrees and each falling edge of the respective pulse signal of the Mth UI clock signal is coincident with each rising edge of the respective pulse signal of the (M+1)st UI clock signal, where M is an integer;
selecting a first UI clock signal and a second UI clock signal from the plurality of N generated UI clock signals, such that the first and second selected UI clock signals share a clock pulse edge;
first asynchronously sampling the first selected UI clock signal, digitally, to determine a first clock pulse width;

second asynchronously sampling the second selected UI clock signal, digitally, to determine a second clock pulse width; and detecting whether there is a phased clock error (PCE) in response to determining that the first and second clock pulse widths differ by more than a predetermined threshold amount.

12. The method of claim 11, wherein:

the first sampling comprises incrementing a counter for each of a plurality of samples of the first selected UI clock signal indicating a logical HIGH;

the second sampling comprises decrementing the counter for each of a plurality of samples of the second selected UI clock signal indicating a logical HIGH; and the detecting comprises determining whether the counter, after sampling the second selected UI clock signal, indicates a value that falls outside a guard band tolerance corresponding to the predetermined threshold amount.

13. The method of claim 11, wherein the generating comprises:

adjusting a signal delay to at least one of the first or second selected UI clock signals in response to the detecting, the adjusting shifting the shared clock pulse edge.

14. The method of claim 13, further comprising:

equaling the first and second selected UI clock signals by iteratively performing the selecting, the first sampling, the second sampling, the detecting, and the adjusting until the detecting determines that the first and second clock pulse widths do not differ by more than the predetermined threshold amount.

15. The method of claim 13, further comprising:

equaling the first and second selected UI clock signals by iteratively performing the selecting, the first sampling, the second sampling, the detecting, and the adjusting until determining one of:

the first and second clock pulse widths do not differ by more than the predetermined threshold amount for each of V successive iterations; or P successive ping-pongs, where each ping-pong is a shifting of the shared clock pulse edge in one direction in one iteration followed by a shifting of the shared clock pulse edge in an opposite direction in a next iteration.

16. The method of claim 13, wherein the adjusting comprises:

selecting one of a plurality of delay circuit paths according to the detecting;

coupling the selected delay circuit path with at least one of the plurality of N phased clock inputs.

17. The method of claim 16, wherein the adjusting further comprises:

generating a delay code according to the detecting, wherein the delay circuit path is selected according to the delay code.

18. The method of claim 11, further comprising:

generating a clock output signal from a combination of the N UI clock signals.

19. A serializer/deserializer (SERDES) transmit clock system comprising:

a unit interval (UI) clock circuit that generates N UI clock signal outputs from N phased clock inputs, each of the UI clock signal outputs having an associated UI delay and comprising a respective pulse signal generated from a respective pair of the phased clock inputs by logically combining one of the respective pair with a complement of the other of the respective pair, the respective pair being phase-delayed each from the other by 360/N degrees, such that any Mth UI clock signal output of the N UI clock signal outputs is offset from any (M+1)st UI clock signal output of the N UI clock signal outputs by 360/N degrees and each falling edge of the respective pulse signal of the Mth UI clock signal output is coincident with each rising edge of the respective pulse signal of the (M+1)st UI clock signal output, where M is an integer;

a phased clock error (PCE) detector circuit, coupled with the UI clock circuit, that detects PCE by determining clock pulse width differences between pairs of the N UI clock signal outputs according to asynchronous digital sampling of respective clock pulse widths of the pairs of the N UI clock signal outputs, each pair having a respective shared clock pulse edge;

a PCE correction circuit, coupled with the PCE detector circuit and the UI clock circuit, that adjusts the UI delays associated with the N UI clock signal outputs according to the detected PCE; and a clock output circuit, coupled with the UI clock circuit, that generates a SERDES transmit clock from a combination of the N UI clock signal outputs.

* * * * *

UNITED STATES PATENT AND TRADEMARK OFFICE
CERTIFICATE OF CORRECTION

PATENT NO. : 9,832,013 B2
APPLICATION NO. : 15/012518
DATED : November 28, 2017
INVENTOR(S) : Chen et al.

Page 1 of 1

It is certified that error appears in the above-identified patent and that said Letters Patent is hereby corrected as shown below:

In Column 1, Line 36, delete "error."" and insert -- error," --, therefor.

In Column 3, Line 67, delete "signals)" and insert -- signals). --, therefor.

In Column 4, Line 12, delete "180."" and insert -- 180," --, therefor.

In Column 7, Line 6, delete "125"" and insert -- 125' --, therefor.

In Column 9, Line 26, delete "225b." and insert -- 225b, --, therefor.

Signed and Sealed this
Tenth Day of July, 2018

Andrei Iancu
*Director of the United States Patent and Trademark Office*